US007298668B2

(12) United States Patent
Hoppe et al.

(10) Patent No.: US 7,298,668 B2
(45) Date of Patent: Nov. 20, 2007

(54) SEMICONDUCTOR MEMORY MODULE WITH BUS ARCHITECTURE

(75) Inventors: Wolfgang Hoppe, Bad Tölz (DE); Srdjan Djordjevic, München (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/346,570

(22) Filed: Feb. 3, 2006

(65) Prior Publication Data

US 2006/0171247 A1 Aug. 3, 2006

(30) Foreign Application Priority Data

Feb. 3, 2005 (DE) ..................... 10 2005 005 064

(51) Int. Cl.
*G11C 8/00* (2006.01)

(52) U.S. Cl. .................. 365/233; 376/230.01; 376/191

(58) Field of Classification Search ................ 365/233, 365/230.01, 191

See application file for complete search history.

(56) References Cited

U.S. PATENT DOCUMENTS 5,032,783 A * 7/1991 Hwang et al. ............ 324/73.1
6,088,829 A * 7/2000 Umemura et al. .......... 714/798
2004/0143773 A1* 7/2004 Chen .......................... 713/400

* cited by examiner

*Primary Examiner*—Thong Q. Le
(74) *Attorney, Agent, or Firm*—Edell, Shapiro & Finnan, LLC

(57) ABSTRACT

A semiconductor memory module, which is formed as an FBDIMM memory module, for example, has a planar design. In the 2R×4 configuration, semiconductor components are arranged in two rows on a top side of a module board and semiconductor memory components are likewise arranged in two rows on an underside of the module board. In contrast to a "Stacked DRAM" design, the semiconductor components in accordance with the planar design contain only one memory chip. By using a parallel routing for a command address bus and an on-die termination bus, the address, clock, and control buses can be adapted in terms of load, so that different signal propagation times on the different buses are avoided to the greatest possible extent.

14 Claims, 9 Drawing Sheets

$R_{CA}$
U32
$R_{CA}$
U24
U22
$TB1_{CAB}$
U20
U18
U36
S2
S1
U33
U2
U4
U6
U8
CA'
U16
$R'_{CA}$
U30
U28
$TB2_{CAB}$
U25
CA
U34
U35
U10
U12
U14

U33
U35
U1
U9
U3
U11
U5
U13
U7
U15
U2
U10
U4
U12
U6
U14
U8
U16
375
200
300
600
145
420
30
TOP
BOT
INT7
V1
V2
V3
V4
V5
V6
AS
A0
CA'
RCA'
Vtt
GND

AS
A0
CAB1
TOP
0.57
BOT
3.15
U35
BOT
3.11
U33
$V_{CAB1}$
$VTB1_{CAB1}$
INT8
19.05
INT6
12.9
INT8
14.3
INT6
17.55
$VTB2_{CAB1}$
$TB1_{CAB1}$
$TB2_{CAB1}$
U1
U2
U3
U4
U5
U6
U7
U8
U9
U10
U11
U12
U13
U14
U15
U16
1.75
13.52
3.49
1.96
9.11
1.66
4.07
1.91
13.62
13.51
9.03
1.04
$R_{CA}$
Vtt
GND

SB
ODTB1
TOP
0.81
VODTB1
BOT
4.73
U35
INT8
7.2
TOP
1.51
U1
INT8
9.96
VTB1ODTB1
INT6
4.13
BOT
1.53
TB1ODTB1
TOP
1.05
U3
INT6
9.04
U2
BOT
1.65
U4
INT6
4.12
TOP
1.05
U5
INT6
9.00
BOT
1.52
U6
INT6
4.15
TOP
1.05
U7
INT6
6.83
BOT
1.44
U8
TOP
2.08
RODTB1
Vtt
GND

AS
U33
TOP
0.81
BOT
5.16
ODTB1
VODTB1
TOP
9.71
TOP
1.42
U9
INT6
9.85
VTB2ODTB1
INT8
3.94
BOT
1.73
U10
TOP
1.05
U11
INT8
8.9
BOT
1.44
U12
INT8
4.25
TB2ODTB1
TOP
1.05
U13
INT8
8.9
BOT
1.44
U14
INT8
4.25
TOP
1.05
U15
INT8
11.0
BOT
1.38
U16
BOT
2.05
RODTB1
Vtt
GND

SB
CLKB1
CLK
/CLK
RCLK
Vtt
GND
U1
U2
U3
U4
U5
U6
U7
U8
U33
8.95
8.55
7.22
13.35
13.34
3.85
15.5
1.53

SB
TOP
5.69
CS
INT8
4.3
CTRLB1
VTB1CTRLB1
TOP
0.56
U1
INT8
14.51
TOP
0.58
U3
INT6
13.66
TOP
0.58
U5
INT6
13.66
TOP
0.58
U7
INT5
10.25
TOP
0.84
TB1CTRLB1
RCTRL
Vtt
GND
TOP
10.41
INT6
3.7
CTRLB1
VTB2CTRLB1
BOT
7.96
U33
TOP
0.56
U9
INT6
13.13
TOP
0.58
U11
INT8
13.66
TOP
0.58
U13
INT8
13.66
TOP
0.58
U15
INT6
8.05
BOT
1.62
TB2CTRLB1
RCTRL
Vtt
GND

SEMICONDUCTOR MEMORY MODULE WITH BUS ARCHITECTURE

CROSS REFERENCE TO RELATED APPLICATIONS

This application claims priority under 35 USC §119 to German Application No. DE 102005005064.6, filed on Feb. 3, 2005, and titled "Semiconductor Memory Module with Bus Architecture," the entire contents of which are hereby incorporated by reference.

FIELD OF THE INVENTION

The present invention relates to a semiconductor memory module in which a control circuit drives a plurality of memory chips via control, clock, and address buses.

BACKGROUND

In a semiconductor memory module, such as an FBDIMM (Fully Buffered Dual-In line Memory Module), for example, a plurality of semiconductor memory components which are driven by a memory controller via a control component, for example a hub chip, rather than directly, are arranged on a module board. Four FBDIMM module cards which differ in terms of their clock frequency and their bit rate, inter alia, have been standardized at the present time. The FBDIMM cards that have been standardized at the present time include the FBD400 card having a bit rate of 400 Mbit/s, the FBD533 card having a bit rate of 533 Mbit/s, the FBD667 card having a bit rate of 667 Mbit/s and the FBD800 card having a bit rate of 800 Mbit/s.

In a 2R×4 design configuration, 18 memory chips are situated per "Rank" on a DIMM module. The memory chips are arranged in the semiconductor memory components on the module board in a stacked arrangement (Stacked DRAM Device). In a 2× stack (Dual Stack) design, two memory chips are arranged in stacked manner within a semiconductor memory component. The individual memory chips are driven by a control circuit on the hub chip for storing or for reading out a stored information item via control, address, and clock buses. In an FBDIMM memory module of the 2R×4 configuration, the control circuit of the hub chip makes four clock signals available, of which two clock signals are used for supplying the memory chips arranged on a left-hand side of the hub chip, and two clock signals are used for driving memory chips arranged on a right-hand side of the hub chip. Given a total of 36 memory chips present on an FBDIMM module of the 2R×4 configuration, nine semiconductor memory components each having two memory chips are arranged on the left-hand side of the hub chip and nine semiconductor memory components each having two memory chips are arranged on the right-hand side of the hub chip. Therefore, a total of 18 memory chips have to be driven by the control circuit of the hub chip on both sides of the hub chip.

For driving the memory chips, the hub chip provides four clock signals, of which two clock signals are used for the memory chips on the left-hand side and two clock signals are used for the memory chips on the right-hand side of the hub chip. For this purpose, the hub chip drives two clock buses on the left-hand side and two clock buses on the right-hand side of the hub chip. In accordance with a JEDEC standard, ten memory chips in each case are connected to a first clock bus on the left-hand and right-hand sides of the hub chip and eight memory chips in each case are connected to a second clock bus on the left-hand and right-hand sides of the hub chip. The clock buses thus have the configuration 10/8/10/8.

For selecting a memory chip, the hub chip provides four select signals (Chip Select Signals). Of these, in each case two select signals are used for the memory chips on the left-hand side of the hub chip and in each case two select signals are used for the memory chips on the right-hand side of the hub chip. In accordance with a JEDEC standard, in each case two control buses are available to the hub chip for transmitting the select signals on the left-hand side and likewise in each case two control buses (CTRL buses) are available on the right-hand side of the hub chip. Of the 36 memory chips, nine memory chips in each case are connected to each of the control buses. The control buses thus have the configuration 9/9/9/9.

For addressing individual memory cells of each of the memory chips, the hub chip makes address signals available. For addressing a memory cell of memory chips which are arranged on the left-hand side of the hub chip, the hub chip is connected to a first address bus, a so-called "Command Address Bus" (CA bus) on the left-hand side and to a second address bus (Command Address Bus, CA Bus) on the right-hand side. Of the 36 memory chips, 18 memory chips in each case are connected to each of the two address buses.

On account of the different load distributions on the clock, control, and address buses, performance losses occur particularly in the case of the cards FBD667 and FBD800. The performance losses relate principally to a non-matched timing behavior ("output timing") of the signals on the different buses. As a result of the different signal propagation times on the different buses, a so-called "early timing" is used on the CA bus particularly in the case of FBD667 and FBD800. In this case, the hub chip emits the different control signals in a delayed manner or in an early manner. However, such a method is very complicated and susceptible to errors since the hub chip has to supervise the control signals on the CA bus and the CTRL bus separately from one another.

In order to obtain a good signal integrity in the FBD667 and FBD800 cards, the memory chips within the semiconductor memory components are provided with an additional input pin, via which a termination resistor (on-die termination resistor) can be switched on. The termination resistor, which is formed as an embedded resistor, is switched on for a write access.

In order to obtain a good signal integrity, it is necessary to provide an on-die termination resistor of an order of magnitude of 50 Ω. However, a termination resistor of 50 Ω has not yet been standardized at the present time. Instead, on-die termination resistors of 75 Ω or 150 Ω are used in accordance with a JEDEC recommendation. However, such resistors prove to be problematic with regard to the signal integrity during writing in the case of a semiconductor memory module of the 2R×4 configuration with "Dual Stacked DRAMs".

A further disadvantage of an FBDIMM module card in the "Stacked Chip" design is the high costs associated therewith.

SUMMARY

The present invention provides a semiconductor memory module with a cost-effective design in which the control, clocks and address buses, for the time-synchronous transmission of control, clock and address signals, are matched in terms of load to the greatest possible extent among one another.

The semiconductor memory module with bus architecture according to the invention comprises a module board, semiconductor memory components each containing a memory chip, the memory chip comprising a memory cell array having memory cells for storing data, and a control component for controlling the memory chips. Furthermore, the module board contains: a plurality of control buses for transmitting a select signal from the control component to a number of the memory chips for selection of one of the memory chips for storing data, the same number of memory chips being connected to each of the control buses; a plurality of address buses for transmitting address signals from the control component to a number of the memory chips for selection of one of the memory cells of the selected memory chip, the same number of memory chips being connected to each of the address buses; and a plurality of clock buses for transmitting a clock signal from the control component to a number of the memory chips for clock-synchronous operation of the memory chips, the same number of memory chips being connected to each of the clock buses. The semiconductor memory components and the control component are arranged on the module board. Furthermore, the number of control buses matches the number of clock buses and the number of memory chips connected to each of the control buses is the same as the number of memory chips connected to each of the clock buses.

The invention makes it possible to construct a memory module as a planar memory module in which each of the semiconductor memory components contains precisely one memory chip. The planar design of the memory module constitutes a more cost-effective variant than a “Stacked DRAM” design, for example, in which each of the semiconductor memory components contains two or more memory chips in a stacked arrangement. The realization of a planar design requires a modification of the bus architecture used hitherto for the address, control and clock buses. In the case of the bus architectures according to the invention for the address, control, and clock buses, the different buses are matched among one another in terms of load. As a result, it is possible to obtain as far as possible identical signal propagation times for the address, control, and clock signals, so that a delay of signals by the hub chip is no longer required. Furthermore, a 75 Ω or 150 Ω resistor proposed as standard can be used as the on-die termination resistor.

The module board of the semiconductor memory module preferably has a first and a second surface. The control component is arranged on the first surface of the module board. A number of the semiconductor memory components are arranged on the first surface of the module board and a remaining number of the semiconductor memory components are arranged on the second surface of the module board. The semiconductor memory components arranged on the first surface of the module board are arranged on first and second sides of the first surface in first and second rows. The semiconductor memory components arranged on the second surface of the module board are arranged on first and second sides of the second surface in first and second rows.

The control component preferably comprises a hub chip with a control circuit, which drives the memory chips via the control, address, and clock buses.

The memory chips preferably contain dynamic random access memory cells.

The module board of the semiconductor memory module is preferably formed as a multilayer printed circuit board. The module board comprises a first outer layer, which adjoins the first surface of the module board, and a second outer layer, which adjoins the second surface of the module board. The module board comprises a plurality of inner layers arranged between the first outer layer and the second outer layer.

In the case of the semiconductor memory module, preferably a first one of the address buses is provided which drives the memory chips on the first side of the first and second surfaces of the module board, and a second one of the address buses is provided which drives the memory chips on the second side of the first and second surfaces of the module board. Each of the first and second address buses is subdivided into a first and a second partial bus. The number of memory chips connected to each of the partial buses of each of the address buses is the same as the number which is also connected to each of the control buses and to each of the clock buses.

The first partial bus of the first and second address buses runs in a first one of the inner layers and the second partial bus of the first and second address buses runs in a second one of the inner layers. The first and second partial buses of the first and second address buses run parallel to one another.

The first partial bus and the second partial bus of the first and second address buses are preferably terminated with a termination resistor arranged on one of the outer layers of the module board.

The control circuit of the hub chip preferably drives a first and a second one of the control buses and a third and a fourth one of the control buses. The first and second control buses each drive a group of memory chips arranged on the first side of the first and second surfaces of the module board. The third and fourth control buses each drive a group of memory chips arranged on the second side of the first and second surfaces of the module board.

Each of the control buses preferably comprises a first and a second partial bus. The first partial bus of each of the control buses runs in one of the inner layers of the module board and the second partial bus of each of the control buses runs in a further one of the inner layers of the module board, the first and second partial buses running parallel to one another. The first partial bus of each of the control buses drives memory chips arranged in the first row on the first or second surface of the module board. The second partial bus of each of the control buses drives memory chips arranged in the second row on the first or second surface of the module board.

The control circuit of the hub chip preferably drives a first and a second one of the clock buses and a third and a fourth one of the clock buses. The first and second clock buses each drive a group of memory chips arranged on the first side of the first and second surfaces of the module board. The third and fourth control buses each drive a group of memory chips arranged on the second side of the first and second surfaces of the module board.

The memory chips each preferably comprise an activatable termination resistor which is activated for a write access to the respective memory chip. The semiconductor memory module furthermore has a first further and a second further control bus for transmitting an activation signal for activating the activatable termination resistor of the memory chips. The control circuit of the hub chip drives the first further and the second further control bus. The first further control bus drives a group of memory chips arranged on the first side of the first and second surfaces of the module board. The second further control bus drives a group of memory chips arranged on the second side of the first and second surfaces of the module board.

The first and second further control buses each comprise a first partial bus and a second partial bus. The number of memory chips connected to each of the partial buses of each of the further control buses is the same as the number of memory chips connected to each of the partial buses of each of the address buses.

In accordance with one development of the semiconductor memory module according to the invention, the first partial bus of the first and second further control buses runs in one of the inner layers of the module board and the second partial bus of the first and second further control buses runs in a further one of the inner layers of the module board, the first and second partial buses running parallel to one another.

The activatable termination resistor preferably has a value of 75 Ω or 150 Ω.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1A:
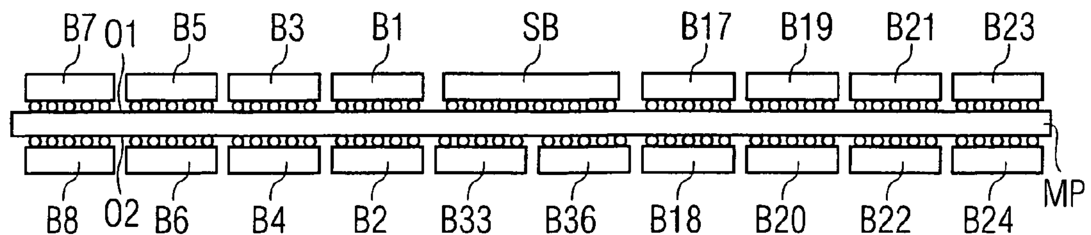
FIG. 1A shows a cross section through an FBDIMM memory module.

FIG. 1A shows a semiconductor memory module formed for example as an FBDIMM semiconductor memory module. The semiconductor memory module has a module board MP, which is populated with semiconductor components on both sides. On a surface O1, for example the top side of the module board, a control component SB is arranged in the center of the module board and semiconductor memory components are arranged on both sides of the control component. The semiconductor memory components B1, B3, B5, and B7 are arranged on the left-hand side of the control component, and the semiconductor memory components B17, B19, B21, and B23 are arranged on the right-hand side of the control component. On the surface O2, for example the underside of the module board MP, the semiconductor memory components B2, B4, B6, and B8 are arranged on a left-hand side as seen from the control component SB. The semiconductor memory components B18, B20, B22, and B24 are arranged on a right-hand side of the surface O2. The semiconductor memory components B33 and B36 are arranged on the surface O2 directly below the control component. These semiconductor memory components generally additionally contain an error correction circuit for correcting memory errors of the rest of the semiconductor memory components.

Figure 1B:
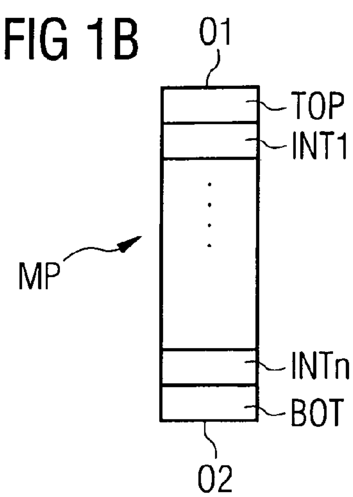
FIG. 1B shows a cross section through a module board of an FBDIMM memory module.

FIG. 1B shows a cross section through the module board MP. The module board MP is formed as a multilayer printed circuit board. It comprises an outer layer TOP adjoining the surface O1, and an outer layer BOT adjoining the surface O2. The inner layers INT1, . . . , INTn are arranged between the two outer layers.

Figure 2A:
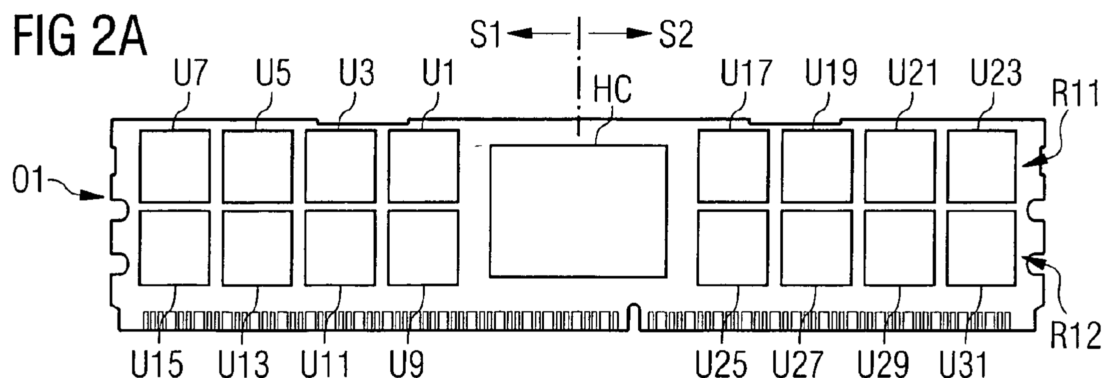
FIG. 2A shows a top side of an FBDIMM semiconductor memory module.

FIG. 2A shows a plan view of the top side O1 of the FBDIMM semiconductor memory module of FIG. 1A. The semiconductor memory module has the 2R×4 configuration. The semiconductor memory module thus comprises two “Ranks”, the memory chips each having the ×4 data organization form. If a “Rank” specifies the amount of memory components necessary to cover the bus width of the memory controller, then a “Rank” comprises 18 memory chips, assuming that the bus width is 72 bits including the ECC memory components. Consequently, 36 memory chips are provided in the 2R(Rank)×4 configuration.

Instead of using a “Stacked DRAM” design, the invention proposes using a planar FBDIMM 2R×4 design. In the case of the planar design in accordance with FIG. 2A, in each case only one memory chip is situated in each semiconductor memory component. On the top side O1 of the semiconductor memory module, the planar memory chips U1, U3, U5, U7, U9, U11, U13, and U15 are situated on the left-hand side S1. The memory chips U17, U19, U21, U23, U25, U27, U29, and U31 are situated on the right-hand side S2 of the surface O1. In this case, the memory chips are arranged in two rows R11 and R12. On the underside O2 of the module board, the memory chips U2, U4, U6, U8, U10, U12, U14, and U16 and also the ECC memory chips U33 and U35 are arranged on the left-hand side S1 of the surface O2. The semiconductor memory chips U18, U20, U22, U24, U26, U28, U30, and U32 and also the ECC memory chips U34 and U36 are arranged on the right-hand side of the surface O2. In this case, too, the memory chips are arranged in two rows, a row R21 and a row R22.

The memory chips have memory cells of the DRAM (Dynamic Random Access Memory) memory cell type. FIG. 3 shows a simplified illustration of a memory cell array SZF of a memory chip from FIGS. 2A and 2B. Within the memory cell array SZF, memory cells SZ are arranged along word lines WL and bit lines BL. A DRAM memory cell has a selection transistor AT and a storage capacitor SC. During the addressing of the memory cell SZ illustrated, the selection transistor AT is controlled to the on state by a corresponding control signal on the word line WL, so that the storage capacitor SC is conductively connected to the bit line BL for the purpose of reading out an item of information or for the purpose of writing in an item of information. In the event of a write access, a termination resistor (On-Die Termination resistor) ODTW embedded in a silicon chip is activated by a control signal ODTS. A connected data bus DQ is terminated by the resistor. In accordance with a JEDEC specification, the termination resistor ODTW is formed as a 75 Ω resistor or as a 150 Ω resistor. It is found that a good signal integrity can be obtained in the case of a 75 Ω resistor or in the case of a 150 Ω resistor when using the planar card design in contrast to the "Stacked DRAM" design. The use of a 50 Ω resistor, as was necessary in the case of the FBD667 and FBD800 cards in the "Stacked" design in order to obtain a good signal integrity, is not necessary when using a planar chip design in which each of the semiconductor memory components contains only one memory chip. The JEDEC standard for the order of magnitude of the on-die termination resistors can thus be complied with.

Figure 4:
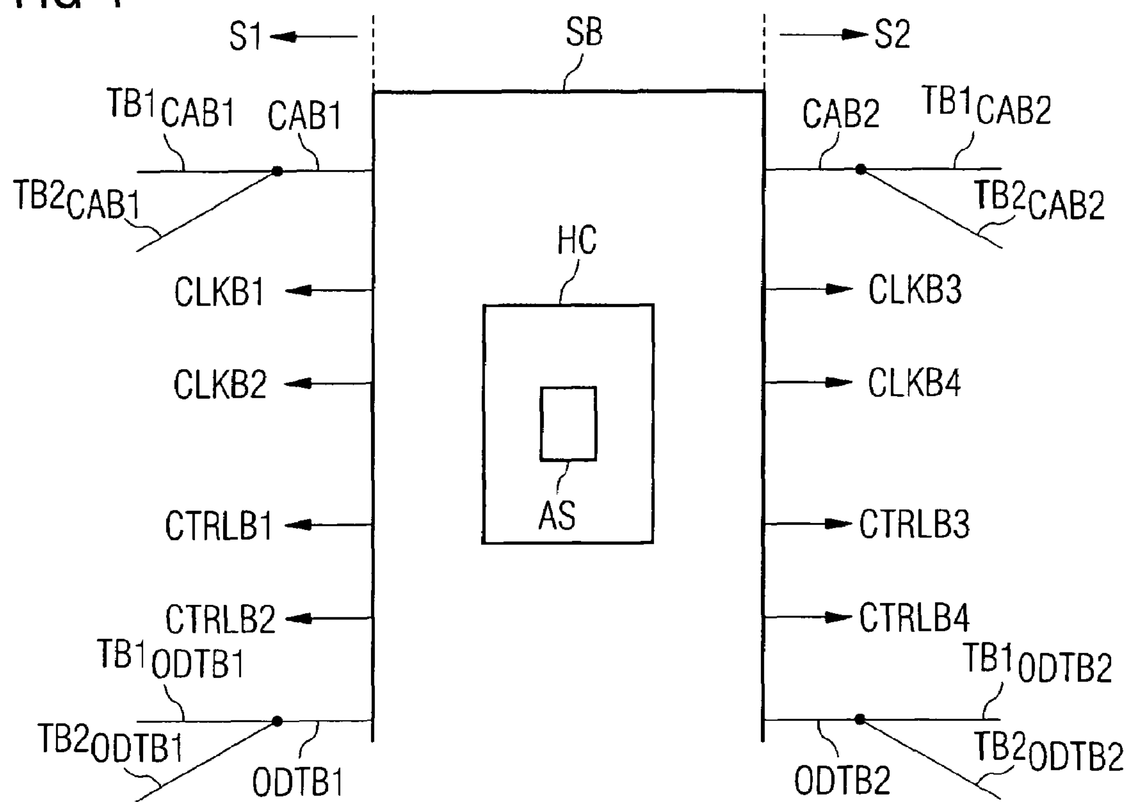
FIG. 4 shows a control component for driving the memory chips on the FBDIMM semiconductor memory module according to an exemplary embodiment of the invention.

FIG. 4 shows the control component SB for driving the memory chips. The control component has internally within it a hub chip HC with a control circuit AS. In accordance with a JEDEC standard, the control circuit AS drives an address bus (Command Address Bus, CA bus) CAB1 on the side S1 and a CA bus CAB2 on the side S2. According to the invention, the CA bus CAB1 is split into a partial bus $\mathbf{TB1}_{CAB1}$ and a partial bus $\mathbf{TB2}_{CAB1}$ at a node. On the side S2, the CA bus CAB2 is likewise divided into a partial bus $\mathbf{TB1}_{CAB2}$ and a partial bus $\mathbf{TB2}_{CAB2}$ at a node.

In accordance with a JEDEC standard, the control circuit AS of the hub chip HC, on the side S1, drives two clock buses (CLK bus) CLKB1 and CLKB2 with a clock signal in order to be able to operate the memory chips clock-synchronously. On the side S2, the drive circuit AS likewise provides two clock signals which are fed onto a CLK bus CLKB3 and CLKB4.

For selecting a memory chip for a storage process, the control circuit AS provides four select signals (Chip Select), a respective one of which is fed onto the control bus (CTRL bus) CTRLB1 and CTRLB2 on the side S1 of the control component and onto the control bus CTRLB3 and CTRLB4 on the side S2 of the control component.

For activating the on-die termination resistor, the control circuit of the hub chip provides a control signal on a further control bus, the so-called "On-Die Termination Bus", ODTB1 on the side S1 and a further control signal on a further on-die termination bus ODTB2 on the side S2 of the control component. According to the invention, the on-die termination bus ODTB1 branches at a node into a partial bus $\mathbf{TB1}_{ODTB1}$ and a partial bus $\mathbf{TB2}_{ODTB1}$. The on-die termination bus ODTB2 on the side S2 branches at a node into a partial bus $\mathrm{TB1}_{ODTB2}$ and a partial bus $\mathbf{TB2}_{ODTB2}$.

Figure 2B:
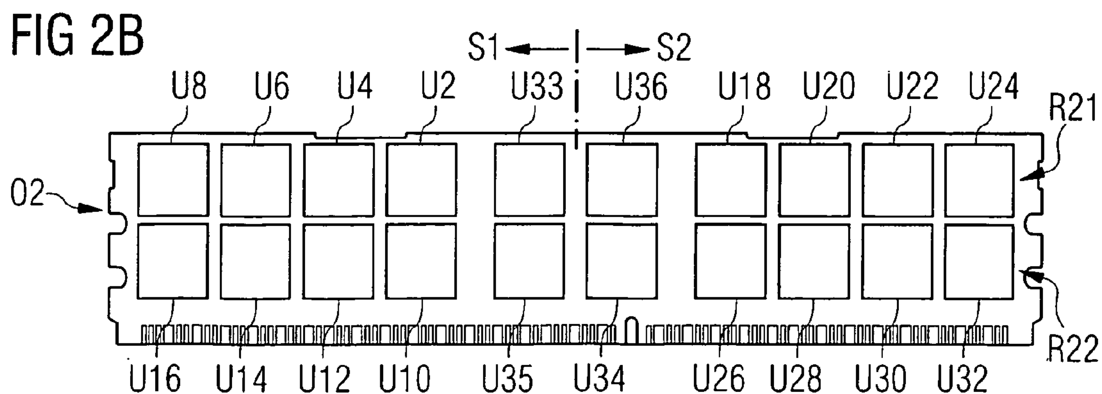
FIG. 2B shows an underside of an FBDIMM semiconductor memory module.
Figure 3:
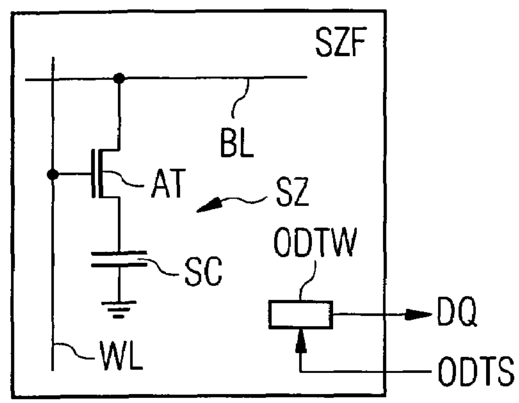
FIG. 3 shows a memory cell array of a memory chip on the FBDIMM semiconductor memory module.
Figure 5:
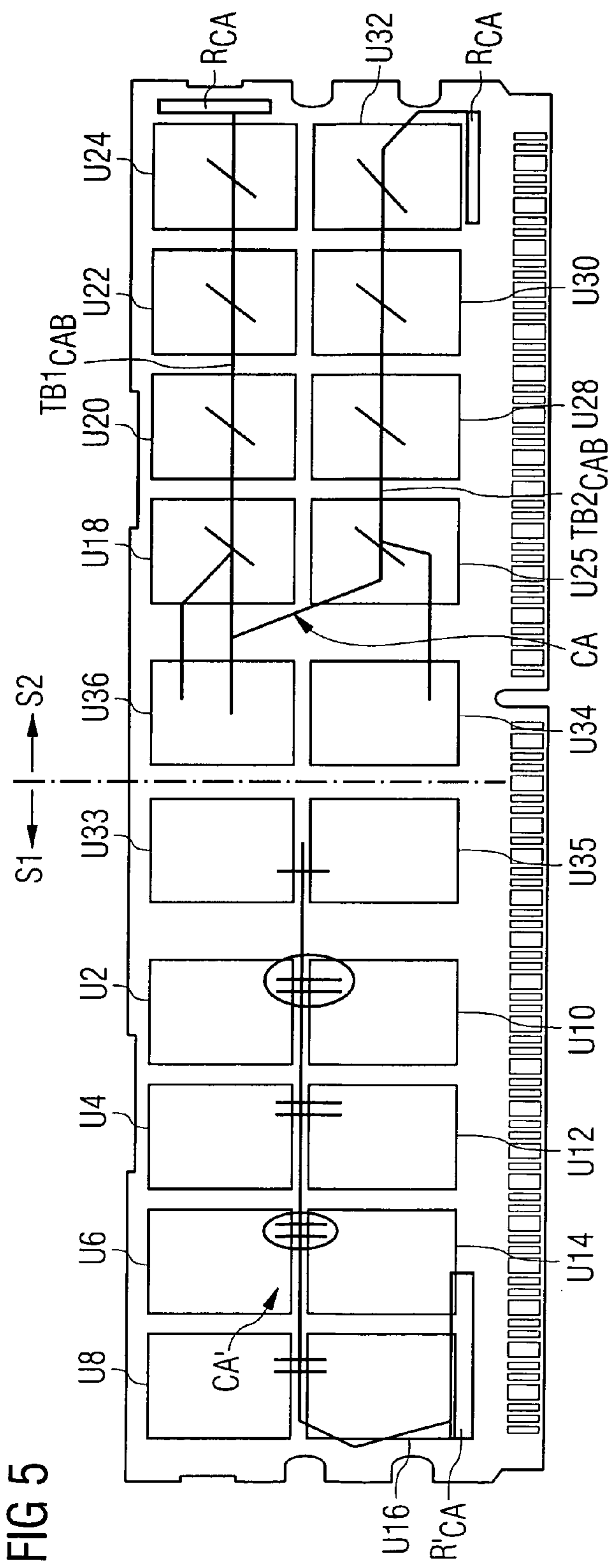
FIG. 5 shows the underside of an FBDIMM semiconductor memory module with a bus architecture of a CA bus according to the prior art in comparison with a CA bus architecture according to an exemplary embodiment of the present invention.

FIG. 5 shows the underside O2 of the FBDIMM semiconductor memory module of FIG. 2B in an enlarged illustration. On the left-hand side S1 the illustration shows a CA bus architecture which has been used hitherto in a "Stacked DRAM" design, whereas on the right-hand side S2 the illustration shows a CA bus architecture according to the invention such as is intended to be used when using the planar design.

Figure 6:
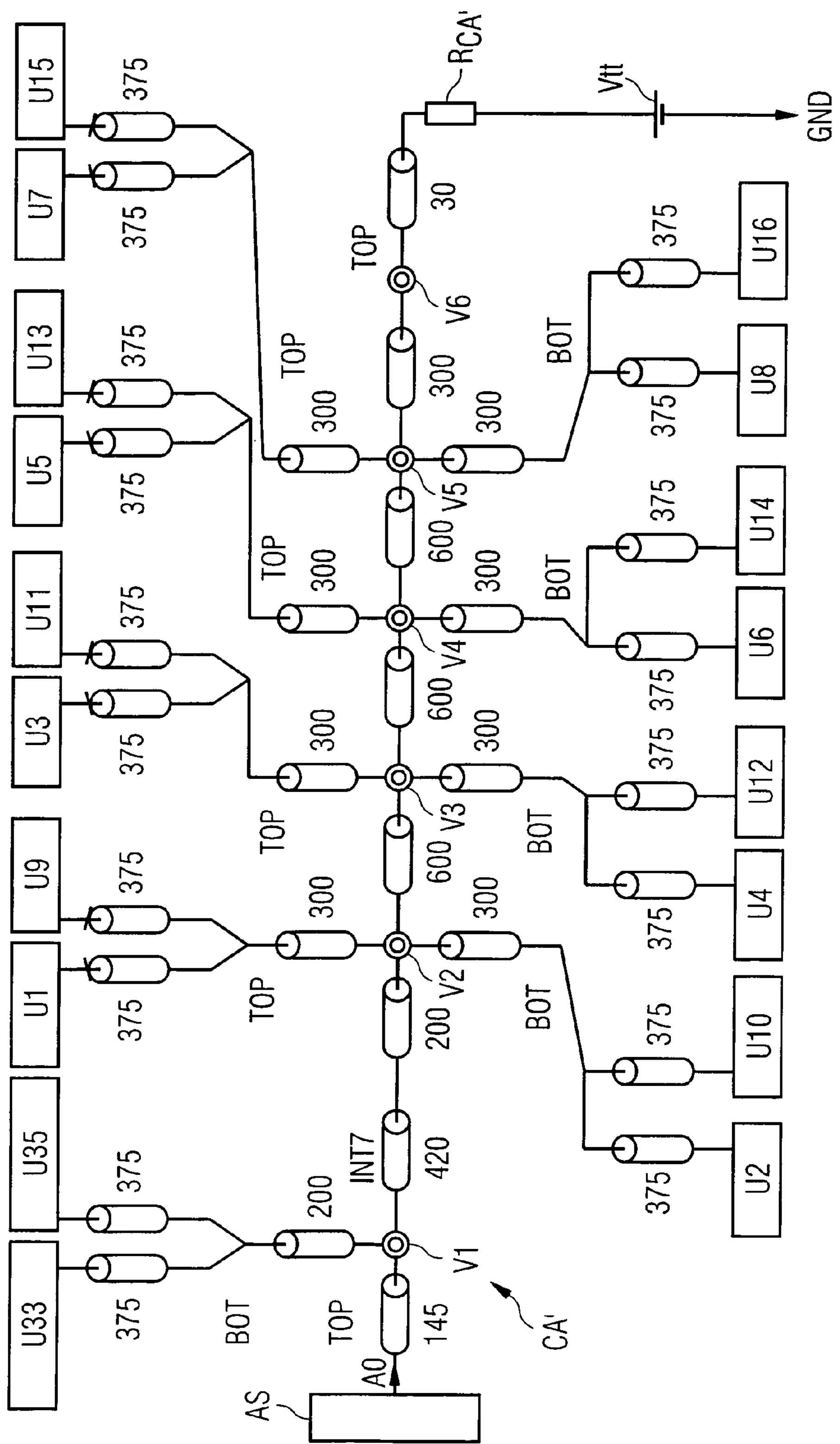
FIG. 6 shows a bus architecture of a CA bus according to the prior art.

The memory chips U2, U4, U6, U8, U10, U12, U14, and U16 and also the ECC memory chips U33 and U35 are driven by a single CA' bus, as has been the case hitherto when using a "Stacked DRAM" design. The CA' bus is terminated by a termination resistor $R'_{CA}$. FIG. 6 shows the structure of an individual CA' bus section which is driven by the control circuit AS with an address signal. The numerical values at the bus segments ("Stub Elements") that are specified in the following structural drawings of the buses specify the length of the stub elements in the order of magnitude $\times 10^{-2}$ mm. The abbreviation TOP designates a stub element of a bus on the surface O1 of the outer layer, whereas the abbreviation BOT corresponds to a stub element on the surface O2 of the module board. The nodes $V_i$ specify via holes of the module board. The abbreviation INT specifies the course of a stub element in an inner layer of the multilayer module board MP.

In accordance with FIG. 6, the control circuit drives the CA' bus with an address signal A0 by a stub element on the top side O1 of the multilayer module board MP having the length 1.45 mm. A crossing by which the control circuit AS is connected to the ECC memory chips U33 and U35 is arranged at a via hole V1. On an internal layer INT7, the main bus section is continued further up to a via hole V2, where a next crossing is arranged, which connects the main bus by a bus section to the memory chips U1 and U9 arranged on the surface O1. A bus section likewise branches from the via hole V2 onto the underside O2 of the multilayer module board to the memory chips U2 and U10. By the via holes V3, V4 and V5, the remaining memory chips on the side S1 of the top side O1 and the underside U2 of the multiplayer board are connected to the main bus section and the control circuit AS. The main bus section is terminated at its end by a termination resistor $R_{CA'}$, which is connected to a reference potential GND by a voltage source Vtt.

Such a bus structure has been recommended according to a JEDEC standard for FBDIMM semiconductor memory modules. When using a module board populated in planar fashion, however, for space reasons it is impossible to connect the 18 memory chips illustrated in FIG. 6 to the main bus section by such a large number of crossings. In this case, it must additionally be taken into account that in total just for the transmission of 16 address signals, three bank address signals, one ODT activation signal, two chip select signals, two command enable signals, three control signals /RAS, /CAS, /WE and four differential clock signals, up to 31 of such bus structures have to be provided between the memory chips and the control circuit AS.

The invention therefore proposes modifying the previous JEDEC recommendation for bus structures. FIG. 5 shows a division of the CA bus into a first partial bus $\mathbf{TB1}_{CAB}$ and a second partial bus $\mathbf{TB2}_{CAB}$ on the side S2 of the underside O2. The two partial buses are terminated by termination resistors $R_{CA}$ on the surface of the module board. The first partial bus $\mathbf{TB1}_{CAB}$ has four nodes corresponding to positions of via holes of the module board. The first partial bus $\mathbf{TB1}_{CAB}$ branches at a first via hole and connects the memory chip U18, by a crossing to the underside O2, to the main bus section $\mathbf{TB1}_{CAB}$ of the first partial bus and, by a crossing illustrated suggestively in FIG. 5, to the memory chip U17 situated opposite the memory chip U18 on the surface O1 of the module board. The main bus section of the first partial bus $\mathbf{TB1}_{CAB}$ is likewise connected, at a subsequent via hole, to the memory chip U20 on the underside and to the opposite memory chip U19 on the top side of the module board. At a subsequent via hole, the main bus section $\mathbf{TB1}_{CAB}$ once again has a crossing, by which the memory chip U22 on the underside O2 and the memory chip U21 on the top side O1 of the module board are connected to the main bus section $\mathbf{TB1}_{CAB}$. A crossing which connects the memory chip U24 on the underside and the memory chip U23 on the opposite top side of the module board to the partial bus $\mathbf{TB1}_{CAB}$ is arranged at a last via hole. Correspondingly, also at the second partial bus $\mathbf{TB2}_{CAB}$ routed parallel to the first partial bus TB1, a total of four crossing points are provided at via holes of the module board, which connect the memory chips U26, U28, U30, and U32 and also the ECC memory chip 35 on the underside of the module board to the second partial bus $TB2_{CAB}$ and, on the top side, the opposite memory chips U25, U27, U29, and U31 to the second partial bus $TB2_{CAB}$.

Figure 7:
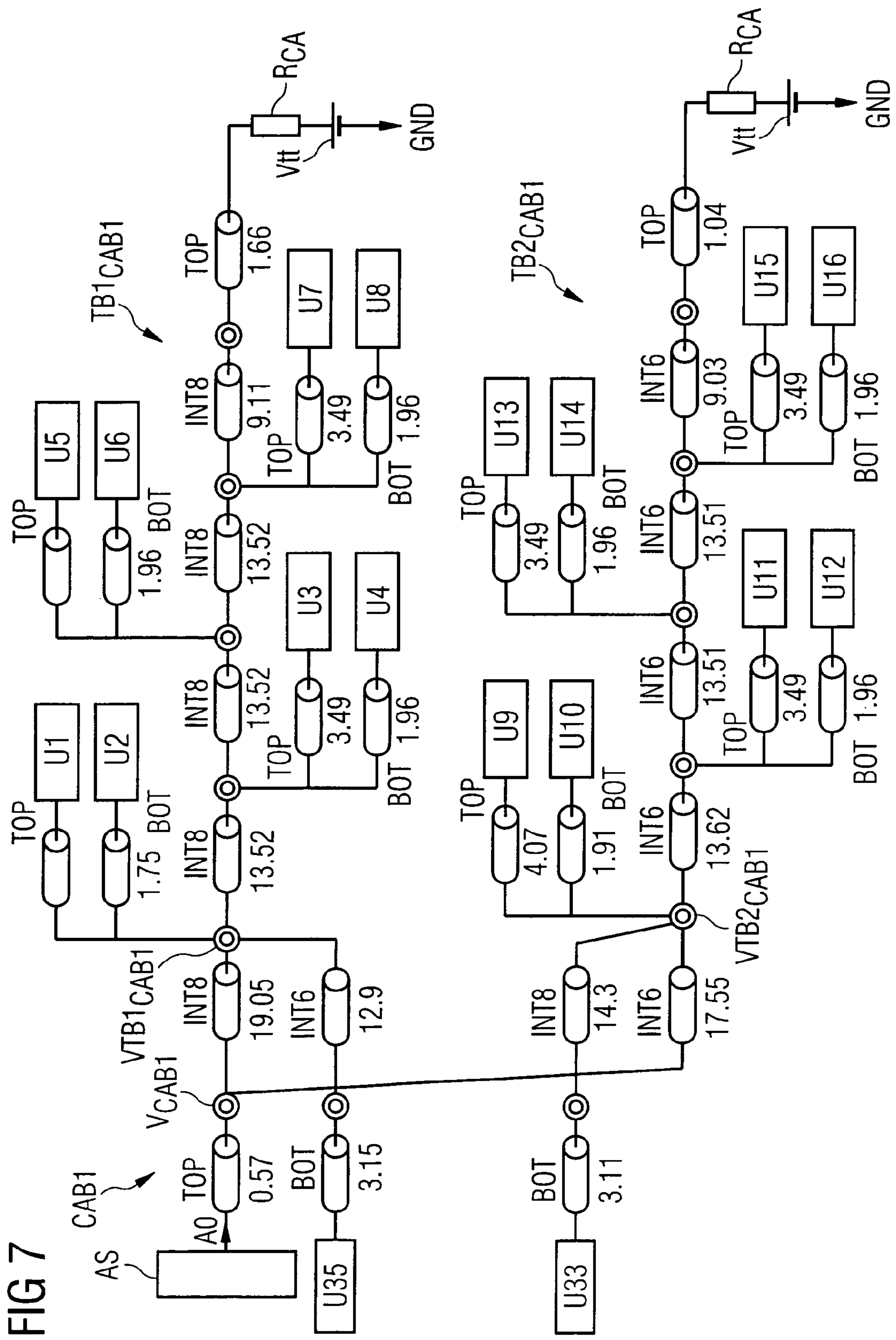
FIG. 7 shows a bus architecture of a CA bus according to an exemplary embodiment of the present invention.

FIG. 7 shows an enlarged illustration of the coupling of the control circuit AS to the CA bus CAB1. The address bus CAB1 branches at a via hole V1 into a first partial bus $TB1_{CAB1}$, which is routed in an inner layer INT8 of the multilayer board, and a second partial bus $TB2_{CAB1}$, which is routed parallel to the partial bus $TB1_{CAB1}$ in an inner layer INT6 of the multilayer board (parallel routing). The two partial buses are terminated by a termination resistor $R_{CA}$ connected to a voltage source Vtt. The first partial bus $TB1_{CAB1}$ is connected by via holes $VTB1_{CAB1}$ to the memory chips U1, U3, U5, and U7 on the top side O1 and to the memory chips U2, U4, U6, and U8 on the opposite underside of the module board. The ECC memory chip U35 is likewise connected to the partial bus $TB1_{CAB1}$ by the first via hole. Correspondingly, the second partial bus $TB2_{CAB1}$ is connected by via holes $VTB2_{CAB1}$ to the memory chips U9, U11, U13, and U15 on the top side of the module board and to the memory chips U10, U12, U14, and U16 and also the ECC memory chip U33 on the underside of the module board. Consequently, nine load elements formed as memory chips are in each case connected both to the first partial bus $TB1_{CAB1}$ and to the second partial bus $TB2_{CAB1}$.

Figure 8A:
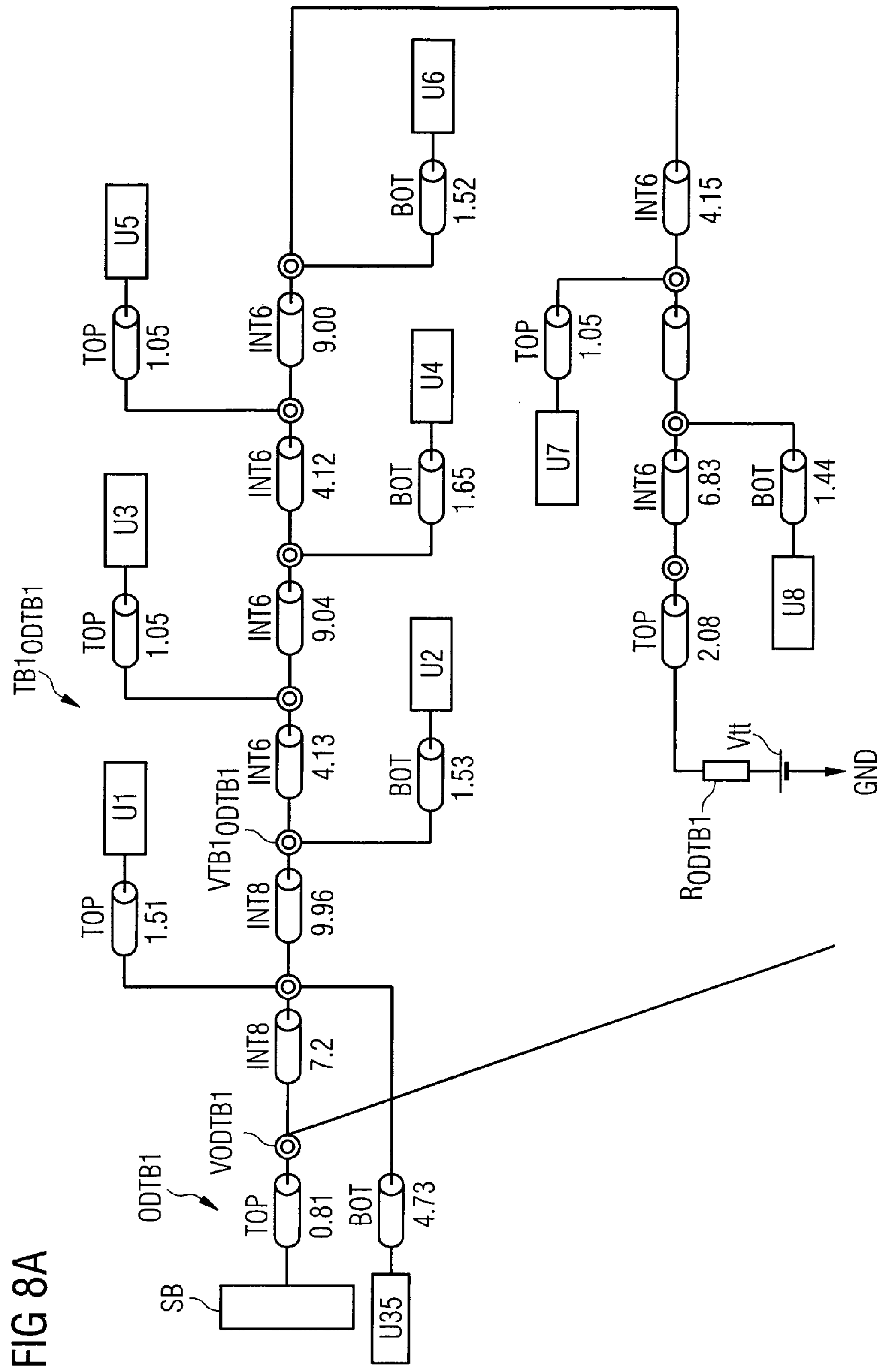
FIG. 8A shows a bus architecture of an ODTL bus according to an exemplary embodiment of the present invention.
Figure 8B:
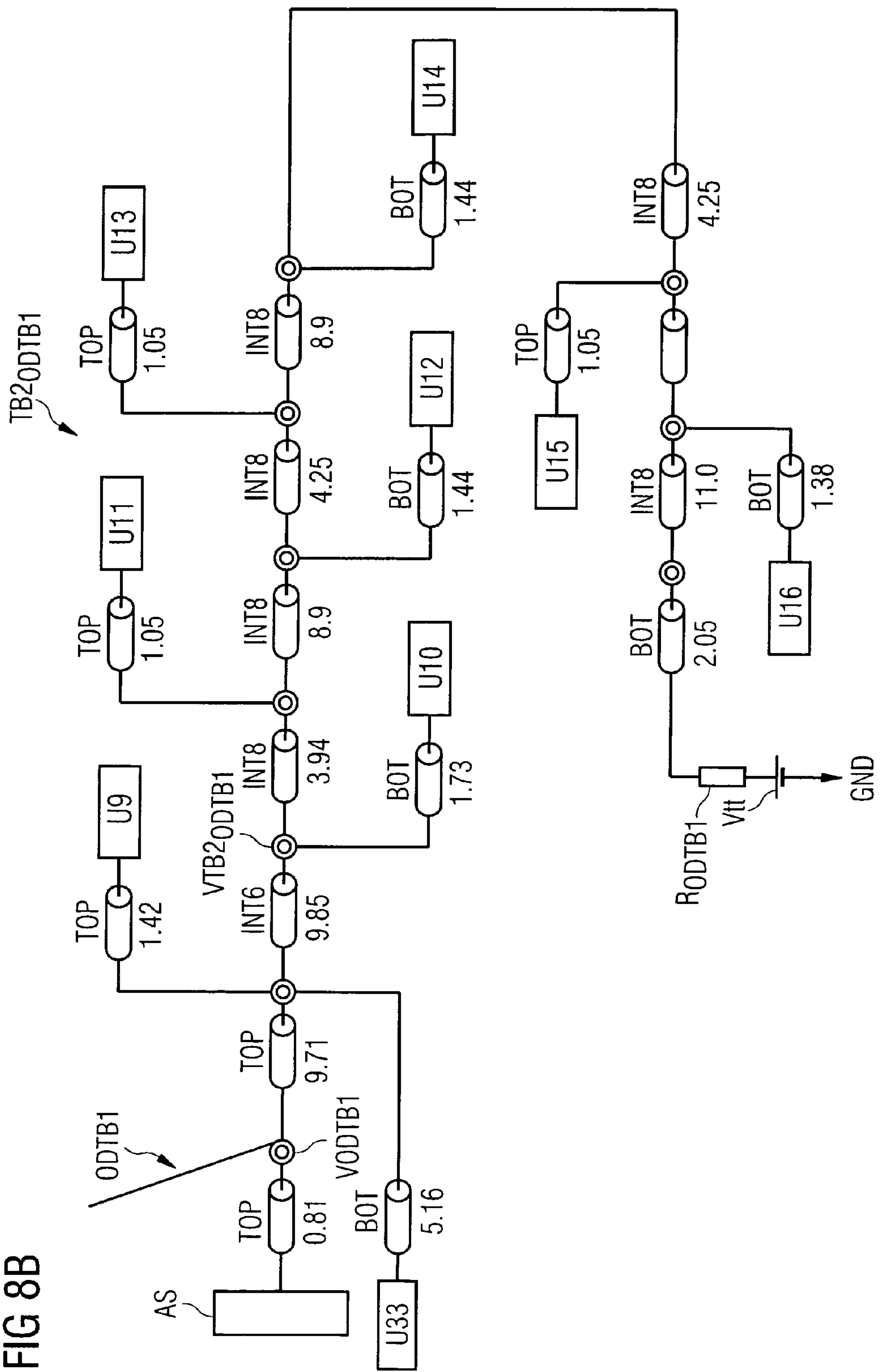
FIG. 8B shows a further bus architecture of an ODTL bus according to an exemplary embodiment of the present invention.

FIGS. 8A and 8B show the structure according to the invention of the ODTL bus for carrying the activation signal for activating the on-die termination resistor of each of the memory chips. A "parallel routing" is used here, too, by virtue of the ODTB1 bus being branched at a via hole $V_{ODTB1}$ into a first partial bus $TB1_{ODTB1}$ and a second partial bus $TB2_{ODTB1}$, the partial buses running parallel to one another. Each of the partial buses is terminated by a termination resistor $R_{ODTB1}$ connected to a voltage source Vtt. By via holes $VTB1_{ODTB1}$, the partial bus $TB1_{ODTB1}$ is connected to the memory chips U1, U3, U5, and U7 on the top side of the module board and to the memory chips U2, U4, U6, and U8 and also the ECC memory chip U35 on the underside of the module board. By via holes $VTB2_{ODTB1}$, the partial bus $TB2_{ODTB1}$ is connected to the memory chips U9, U11, U13, and U15 on the top side of the module board and to the memory chips U10, U12, U14, and U16 and also the ECC memory chip U33 on the underside of the module board. Each partial bus of the on-die termination bus ODTB1, as well as the partial buses of the CA bus, are connected to nine load elements in each case.

Figure 9:
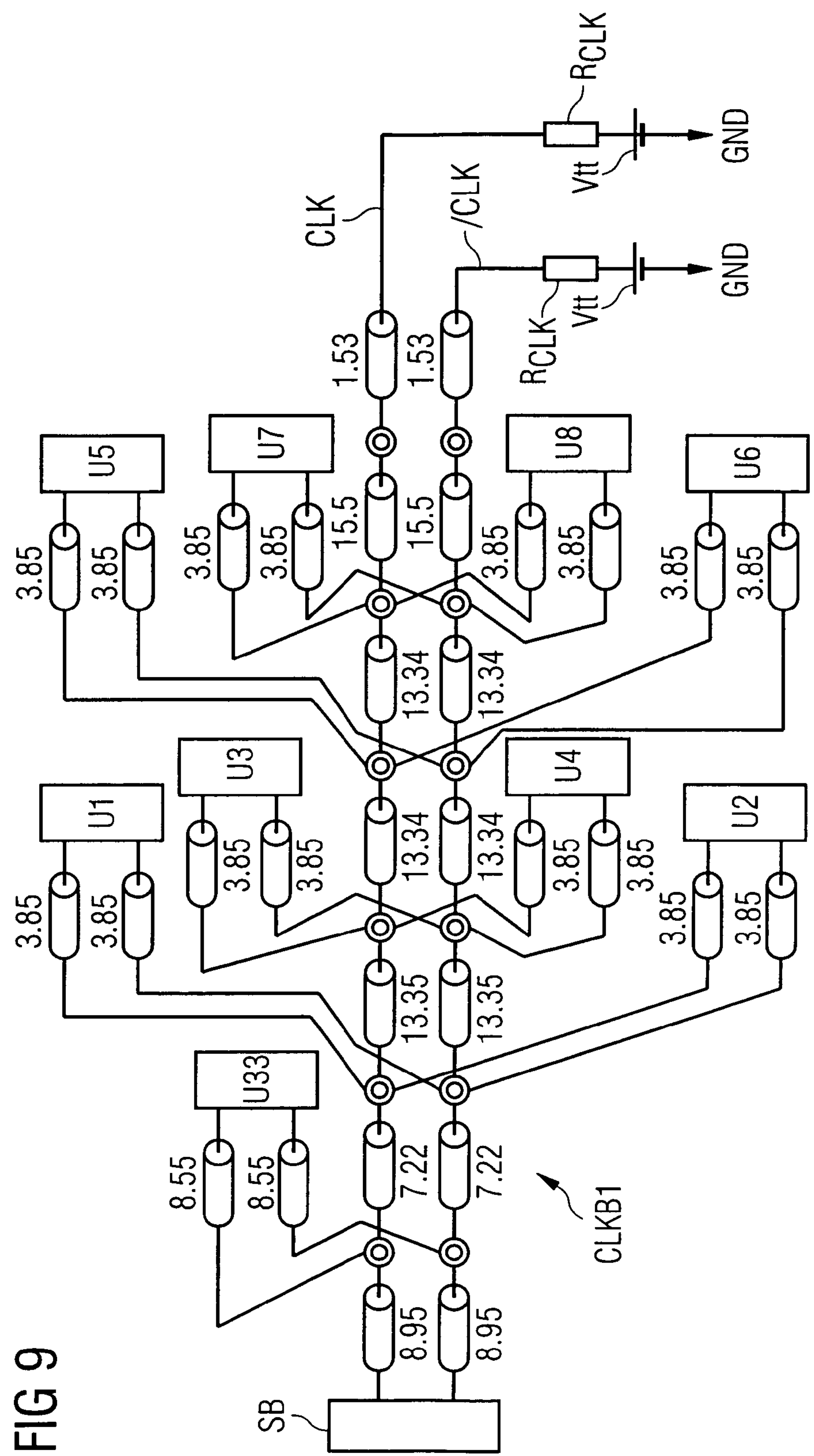
FIG. 9 shows a bus architecture of a CLK bus according to an exemplary embodiment of the present invention.

FIG. 9 shows the structure of the clock bus CLKB1, which has a bus section for carrying a clock signal CLK and a bus section—running parallel thereto—for carrying the complementary clock signal /CLK. The two bus sections are terminated by termination resistors $R_{CLK}$ connected to a voltage source Vtt. Each bus section is connected to a total of nine load elements, the memory chips U1, U3, U5, and U7 on the top side of the module board and also the memory chips U2, U4, U6, and U8 and also the ECC memory chip U33 on the underside of the module board. The clock buses CLKB2, CLKB3 and CLKB4, which are likewise driven by the control circuit AS in accordance with FIG. 4, have an identical construction, so that here, too, in each case nine of the memory chips are connected to each of the clock buses.

Figure 10:
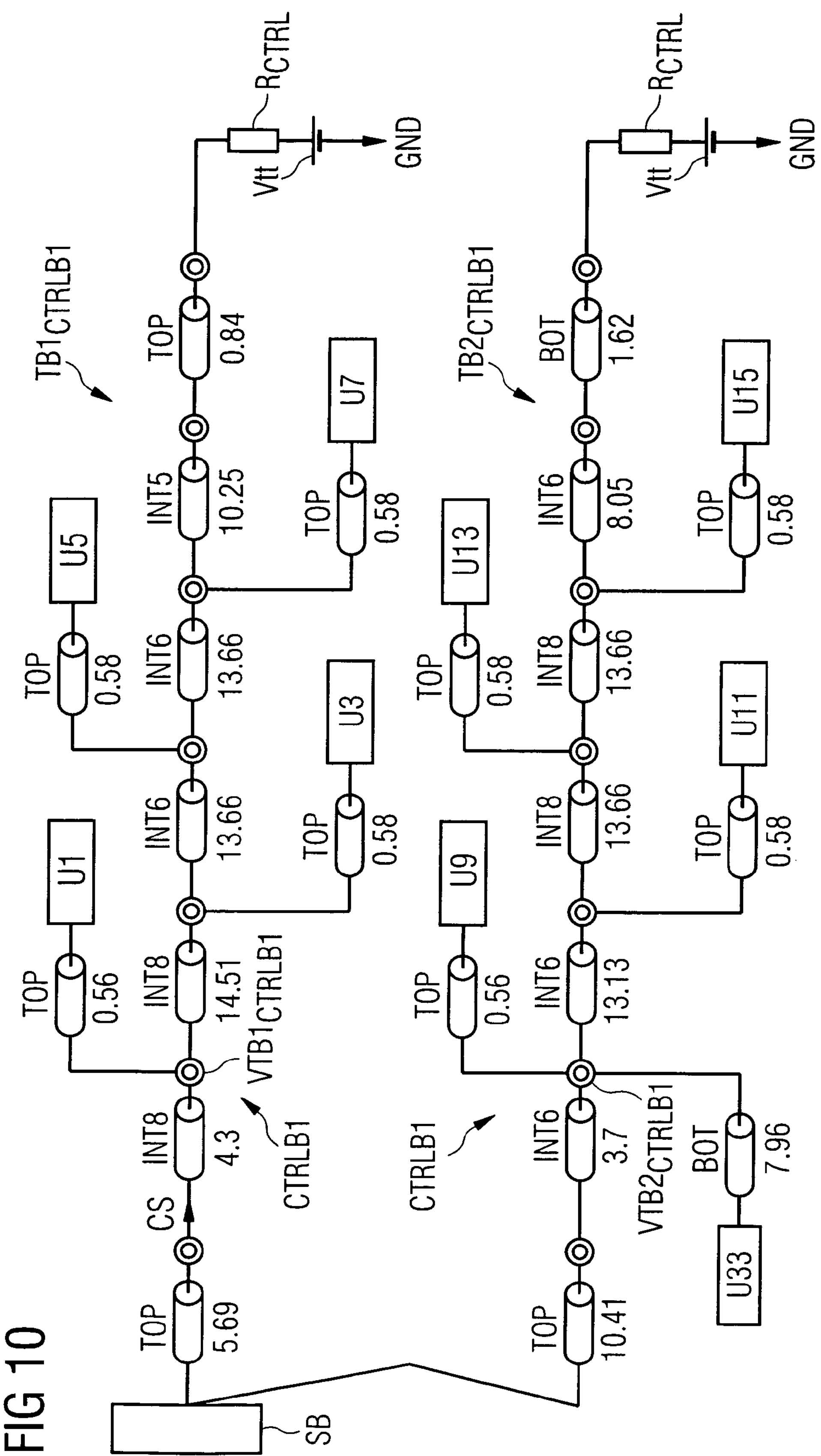
FIG. 10 shows a bus architecture of a CTRL bus according to an exemplary embodiment of the present invention.

FIG. 10 shows the structure of the control bus CTRLB1, which is connected to the control circuit AS on the side S1 of the module board. The control bus CTRLB1 for carrying the select signal CS has two partial buses $TB1_{CTRLB1}$ and $TB2_{CTRLB1}$ routed parallel, which are in each case terminated by a termination resistor $R_{CTRL}$, connected to a voltage source Vtt. By via holes $VTB1_{CTRLB1}$, the partial bus $TB1_{CTRLB1}$ is connected to the memory chip U1, U3, U5, and U7 on the top side O1 of the module board. By via holes $VTB2_{CTRLB1}$, the partial bus $TB2_{CTRLB1}$ is connected to the memory chips U9, U11, U13, and U15 on the top side of the module board and also to the ECC memory chip U33 on the underside of the module board. The control bus CTRLB1 is thus likewise connected to a total of nine load elements.

The use of the bus architecture for the address bus (CA bus) in accordance with FIG. 7, the bus architecture for the on-die termination bus (ODTL bus) in accordance with FIGS. 8A and 8B, the use of the bus architectures for the clock buses (CLK bus) in accordance with FIG. 9, and the use of the bus architectures for the control buses (CTRL buses) in accordance with FIG. 10 make it possible for an FBDIMM memory module of the 2R×4 configuration now to be constructed in a planar DRAM design, in contrast to the hitherto customary "Stacked DRAM" design. Both the clock buses CLKB1 and CLKB2 which drive the memory chips on the side S1 of the hub chip and the clock buses CLKB3 and CLKB4 which drive the memory chips on the side S2 of the hub chip are connected to nine load elements in each case. Nine load elements (memory chips) in each case are likewise also connected to the control buses CTRLB1 and CTRLB2 which connect the hub chip to the memory chips on the side S1 and to the control buses CTRLB3 and CTRLB4 which connect the hub chip to the memory chips on the side S2. The CA bus sections CAB1 on the side S1 and CAB2 on the side S2 are connected to 18 load elements in each case, but have in each case two partial branches which are likewise connected to nine load elements. The bus sections ODTB1 and ODTB2 are likewise subdivided into two partial buses with nine load elements in each case.

This ensures that the address, clock and control buses are well matched among one another in terms of load. This has the advantage that the signal propagation times on the different buses are very well matched, so that the use of an "Early Timing" by a hub chip is no longer necessary. It is furthermore evident that by using the planar FBDIMM 2R×4 design in combination with the bus architectures according to the invention, the data bus DQ can now be terminated with a standard 75 Ω or 150 Ω resistor instead of with a 50 Ω on-die termination resistor and a good signal integrity is nevertheless obtained in this case.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of Reference Symbols | |
|---|---|
| MP | Module board |
| B | Semiconductor memory component |
| SB | Control component |
| O | Surface |
| S | Side |
| U | Memory chip |
| R | Row |
| SZF | Memory cell array |
| BL | Bit line |

-continued

| List of Reference Symbols | |
|---|---|
| WL | Word line |
| AT | Selection transistor |
| SC | Storage capacitor |
| SZ | Memory cell |
| ODTW | On-die termination resistor |
| ODTS | Activation signal |
| DQ | Data bus |
| HC | Hub chip |
| AS | Control circuit |
| CAB | Command address bus |
| CLKB | Clock bus |
| CTRLB | Control bus |
| TB | Partial bus |
| ODTB | On-die termination bus |
| INT | Internal layer |
| TOP | Top outer layer |
| BOT | Bottom outer layer |

What is claimed is:

1. A memory module with bus architecture, comprising:

a module board including a first surface and a second surface;

a plurality of memory components respectively containing memory chips each comprising a memory cell array including memory cells for storing data, wherein a number of the memory components is arranged on the first surface of the module board on first and second sides of the first surface in first and second rows and a remaining number of the memory components is arranged on the second surface of the module board on first and second sides of the second surface in first and second rows;

a control component arranged on the first surface of the module board, for controlling the memory chips;

a plurality of control buses for transmitting a select signal from the control component to a number of the memory chips for selection of one of the memory chips for storing data, wherein the same number of memory chips is connected to each of the control buses;

a plurality of address buses for transmitting address signals from the control component to a number of the memory chips for selection of one of the memory cells of a selected memory chip, wherein the same number of memory chips is connected to each of the address buses; and a plurality of clock buses for transmitting a clock signal from the control component to a number of the memory chips for clock-synchronous operation of the memory chips, wherein the same number of memory chips is connected to each of the clock buses;

wherein the number of control buses matches the number of clock buses, and the number of memory chips connected to each of the control buses is the same as the number of memory chips connected to each of the clock buses.

2. The memory module of claim 1, wherein the control component comprises a hub chip with a control circuit, which drives the memory chips via the control, address, and clock buses.

3. The memory module of claim 1, wherein the memory chips include dynamic random access memory cells.

4. The memory module of claim 1, wherein:

the module board is formed as a multilayer printed circuit board;

the module board comprises a first outer layer that adjoins the first surface of the module board, and a second outer layer that adjoins the second surface of the module board; and the module board comprises a plurality of inner layers arranged between the first outer layer and the second outer layer.

5. The memory module of claim 4, wherein:

a first one of the address buses drives the memory chips on the first side of the first and second surfaces of the module board and a second one of the address buses drives the memory chips on the second side of the first and second surfaces of the module board;

each of the first and second address buses is subdivided into a first and a second partial bus; and the number of memory chips connected to each of the partial buses of each of the address buses is the same as the number of memory chips connected to each of the control buses and to each of the clock buses.

6. The memory module of claim 5, wherein the first partial bus of the first and second address buses runs in a first one of the inner layers and the second partial bus of the first and second address buses runs in a second one of the inner layers, the first and second partial buses of the first and second address buses running parallel to one another.

7. The memory module of claim 5, wherein the first partial bus and the second partial bus of the first and second address buses are terminated with a termination resistor arranged on one of the outer layers of the module board.

8. The memory module of claim 4, wherein:

the control circuit of the hub chip drives a first and a second one of the control buses and a third and a fourth one of the control buses;

the first and second control buses each drive a group of memory chips arranged on the first side of the first and second surfaces of the module board; and the third and fourth control buses each drive a group of memory chips arranged on the second side of the first and second surfaces of the module board.

9. The memory module of claim 8, wherein:

each of the control buses comprises a first and a second partial bus;

the first partial bus of each of the control buses runs in one of the inner layers of the module board and the second partial bus of each of the control buses runs in a further one of the inner layers of the module board parallel to one another;

the first partial bus of each of the control buses drives memory chips arranged in the first row on the first or second surface of the module board; and the second partial bus of each of the control buses drives memory chips arranged in the second row on the first or second surface of the module board.

10. The memory module of claim 2, wherein:

the control circuit of the hub chip drives a first and a second one of the clock buses and a third and a fourth one of the clock buses;

the first and second clock buses each drive a group of memory chips arranged on the first side of the first and second surfaces of the module board; and the third and fourth control buses each drive a group of memory chips arranged on the second side of the first and second surfaces of the module board.

11. The memory module of claim 5, wherein the memory chips each comprise an activatable termination resistor which is activated for a write access to a respective memory chip, the memory module further comprising a first further control bus and a second further control bus for transmitting an activation signal for activating the activatable termination resistor of the memory chips, wherein:

the control circuit of the hub chip drives the first and second further control buses;

the first further control bus drives a group of memory chips arranged on the first side of the first and second surfaces of the module board; and the second further control bus drives a group of memory chips arranged on the second side of the first and second surfaces of the module board.

12. The memory module of claim 11, wherein the first and second further control buses each comprise a first partial bus and a second partial bus, and wherein the number of memory chips connected to each of the partial buses of each of the further control buses is the same as the number of memory chips connected to each of the partial buses of each of the address buses.

13. The memory module of claim 12, wherein the first partial bus of the first and second further control buses runs in one of the inner layers and the second partial bus of the first and second further control buses runs in a further one of the inner layers, the first and second partial buses running parallel to one another.

14. The memory module of claim 11, wherein the activatable termination resistor has a value of 75 Q or ISO Q.

* * * * *

UNITED STATES PATENT AND TRADEMARK OFFICE

CERTIFICATE OF CORRECTION

PATENT NO. : 7,298,668 B2
APPLICATION NO. : 11/346570
DATED : November 20, 2007
INVENTOR(S) : Wolfgang Hoppe et al.

It is certified that error appears in the above-identified patent and that said Letters Patent is hereby corrected as shown below:

Col. 14, I. 12: "value of 75 Q or ISO Q" should read:

--value of 75 Ω or 150 Ω--

Signed and Sealed this

Twenty-ninth Day of April, 2008

JON W. DUDAS
*Director of the United States Patent and Trademark Office*